United States Patent [19]
Hiroki et al.

[11] Patent Number: 5,196,717
[45] Date of Patent: Mar. 23, 1993

[54] FIELD EFFECT TRANSISTOR TYPE PHOTO-DETECTOR

[75] Inventors: Tamayo Hiroki, Ebina; Hidetoshi Nojiri, Hadano, both of Japan

[73] Assignee: Canon Kabushiki Kaisha, Tokyo, Japan

[21] Appl. No.: 807,622

[22] Filed: Dec. 13, 1991

Related U.S. Application Data

[63] Continuation of Ser. No. 610,940, Nov. 9, 1990, abandoned.

[30] Foreign Application Priority Data

Nov. 14, 1989 [JP] Japan .................................. 1-293927

[51] Int. Cl.$^5$ ............................................. H01L 27/14
[52] U.S. Cl. .................................... 257/21; 257/188; 257/257; 257/453; 257/183.1
[58] Field of Search ............... 357/22 J, 30 C, 30 E, 357/22 A, 15, 4, 22 MD, 22 B, 22 C

[56] References Cited

U.S. PATENT DOCUMENTS

| | | | |
|---|---|---|---|
| 4,346,394 | 8/1982 | Figueroa et al. | 357/30 |
| 4,593,304 | 6/1986 | Slayman | 357/30 E |
| 4,829,346 | 5/1989 | Kasahara et al. | 357/16 X |

OTHER PUBLICATIONS

Chen et al., "Ultrahigh Speed Modulation-Doped Heterostructure Field-Effect Photodetectors", *Applied Physics Letters*, vol. 42, No. 12, pp. 1040-1042.

Liou, J. et al., "Slow Relaxation and Electric Field Quenching of Persistent conductivity in GaAs Metal-Semiconductor Field-Effect Transistors with Different Buffer Layer Structures", *Applied Physics Letters*, vol. 51, No. 24, Dec. 14, 1987, New York, NY, pp. 2010-2012.

Chang, C, et al., "Negative Photoconductivity in High Electron Mobility Transistors," *Applied Physics Letters*, vol. 51, No. 26, Dec. 28, 1987, pp. 2233-2235 New York, NY.

Umeda et al., "Effect of Incident Light Illumination Shape on Responsivity of GaAs MESFET Photodetector", *Japanese Journal of Applied Physics*, vol. 24, No. 5, Part 2, May 1985, pp. L367-L369 Tokyo, JP.

*Primary Examiner*—William Mintel
*Attorney, Agent, or Firm*—Fitzpatrick, Cella, Harper & Scinto

[57] ABSTRACT

A field effect type photo-detector comprises a semiconductor buffer layer arranged on a substrate. A semiconductor activation layer is arranged on that buffer layer, and a source electrode, a drain electrode and a gate electrode are arranged on the activation layer. A depletion layer for controlling a current flow between the source electrode and the drain electrode is created in the activation layer by applying a voltage to the gate electrode. When light irradiates the activation layer, the depletion layer changes. The buffer layer has a wider band gap than that of the activation layer and has an energy gap which serves as a barrier to carriers. The buffer layer has a sufficiently wide band gap to prevent the absorption of light having an equal wavelength to that of the light irradiated to the activation layer.

12 Claims, 2 Drawing Sheets

FIELD EFFECT TRANSISTOR TYPE PHOTO-DETECTOR

This application is a continuation of application Ser. No. 07/610,940 filed Nov. 9, 1990, now abandoned.

BACKGROUND OF THE INVENTION

1. Field of the Invention

The present invention relates to a photo-detector, and more particularly to a field effect transistor (FET) type photo-detector which is suitable for use in a light integrated circuit.

2. Related Background Art

As high speed photo-detectors, a pin photo-diode (pin-PD) and an avalanche photo-diode (APD) have been known. However, the pin-PD has no amplification function. The APD, though it has the amplification function, need a high biasing voltage in operation and hence it is not suitable in an integrated circuit.

High speed FET type photo-detectors which solve the above problems have been proposed by Umeda et al. in Papers of The Institute of Electronics and Communication Engineers of Japan, vol. J68-C, p. 263 (1985) and C. Y. Chen et al. in Appl. Phys. Letter. 42, p. 1040 (1983).

FIG. 1 shows a cross-sectional view of a GaAs-MESFET type photo-detector. In this photo-detector, a non-doped GaAs buffer layer 35 is laminated on a GaAs semi-insulative substrate 36, and an n type GaAs activation layer 34 having a thickness of 0.2 to 0.5 μm is laminated on the buffer layer 35. A source electrode 31, a gate electrode 32 and a drain electrode 33 for inputting and outputting currents are formed on the activation layer 34. When the photo-detector is biased through the electrodes 31, 32 and 33 and an incident light 38 is applied to the surface or cross-sectional plane, a photocurrent flows across the drain electrode 33 and the source electrode 31 so that the incident light 38 can be detected.

Such an FET type photo-detector has advantages of relatively low biasing voltage, a built-in amplification function and applicability to a driver or an amplifier of an integrated semiconductor laser (LD).

However, in the photo-detector of the structure shown in FIG. 1, both the activation layer and the buffer layer are made of GaAs and have the same band gap. Accordingly, when a light having a larger beam diameter than the thickness of the activation layer is irradiated to the end plane of the photo-detector, the light is irradiated to the activation layer as well as the buffer layer so that it is absorbed by the buffer layer, too. In the buffer layer, electron-hole pairs are generated due to the light absorption and the carriers are diffused and reach a depletion layer 37 in the activation layer or are recombined before they reach the depletion layer. As a result, a time response characteristic is deteriorated. Further, the confinement of the carriers in the activation layer which functions as a channel is not sufficient but the carriers leak to the buffer layer and the substrate. As a result, a pinch-off characteristic is deteriorated and an S/N ratio is lowered and a sensitivity is lowered.

SUMMARY OF THE INVENTION

It is an object of the present invention to provide a high speed and high sensitivity FET type photo-detector which solves the problems encountered in the prior art photo-detector.

The above object of the present invention is achieved by a field effect transistor type photo-detector comprising a semiconductor buffer layer formed on a substrate.

A semiconductor activation layer is disposed on the buffer layer and a source electrode, a drain electrode and a gate electrode are disposed on the activation layer.

A depletion layer for controlling a current flowing between the source electrode and the drain electrode is formed in the activation layer by applying a voltage to the gate electrode. When a light is irradiated to the activation layer, the width of the depletion layer changes, and the buffer layer has a wider band gap than that of the activation layer and has an energy band to serve as a barrier to carriers.

BRIEF DESCRIPTION OF THE INVENTION

DETAILED DESCRIPTION OF THE PREFERRED EMBODIMENTS

Figure 1:
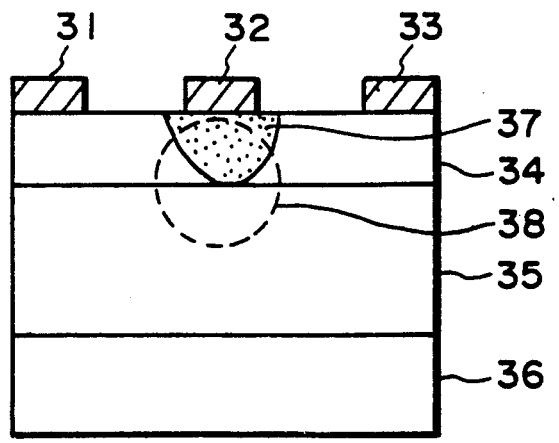
FIG. 1 shows a cross-sectional view of a prior art FET type photo-detector.
Figure 2A:
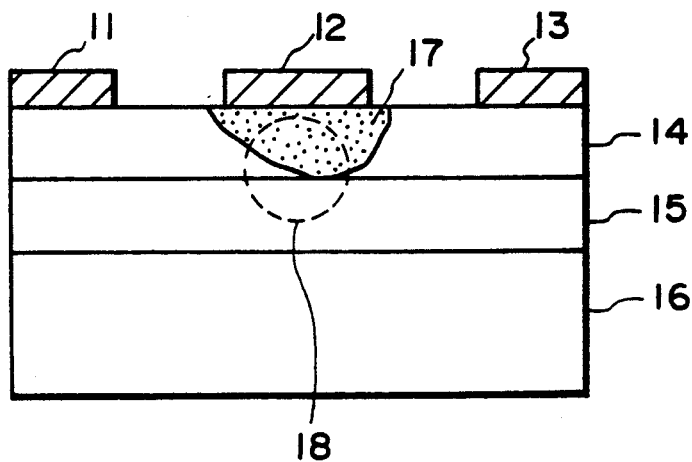
FIGS. 2A and 2B show a cross-sectional view and an energy band of a first embodiment of an FET type photo-detector of the present invention.
Figure 2B:
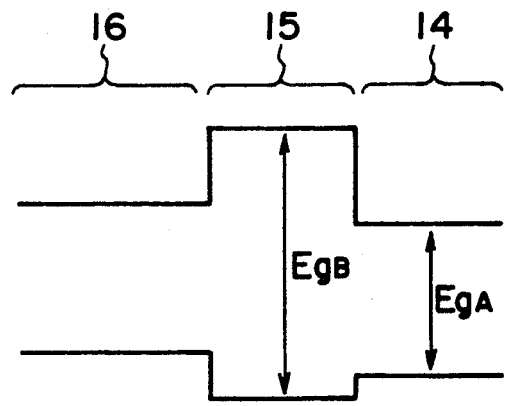

FIGS. 2A and 2B show a cross-sectional view and an energy band of a first embodiment of the FET type photo-detector of the present invention. The like elements are designated by the like numerals.

In the FET type photo-detector of the present embodiment, a p-$Al_{0.3}Ga0.7As$ buffer layer 15 having a thickness of 0.4 μm is deposited on a semi-insulative GaAs substrate 16, and an n-GaAs activation layer 14 having a thickness of 0.2 μm is deposited thereon. As shown in FIG. 2A, an energy gap $Eg_B$ of the buffer layer 15 is wider than an energy gap $Eg_A$ of the activation layer 14. The buffer layer 15 has an energy band which acts as a barrier to the carriers. For example, in the present embodiment, since the carriers are primarily electrons, a potential of a conduction band of the buffer layer 15 is selected to be higher than a potential of a conduction band of the activation layer 14. Where the carriers are primarily holes, a potential of a fill band of the buffer layer 15 is selected to be lower than a potential of a fill band of the activation layer 14. AuGe/Au source electrode 11 and drain electrode 13, and an Al gate electrode 12 are formed on the activation layer 14. A gate length is 1 μm, a gate width is 200 μm and a spacing between the respective electrodes is 1 μm.

In the photo-detector of the above construction, when a positive voltage $V_D$ is applied to the source electrode 11 and a voltage $V_G$ is applied to the gate electrode 12, electrons flow in the activation layer 14 from the source electrode 11 to the drain electrode 13. Since the gate electrode 12 is a Schotcky electrode, the depletion layer 17 extends into the activation layer. Since the width of the depletion layer 17 changes with the gate voltage $V_G$, a channel width which provides a path for the electrons in the activation layer 14 changes accordingly. As a result, a drain current $I_D$ which flows between the drain electrode 13 and the source electrode 11 changes, and when the depletion layer 17 reaches the buffer layer 15, the channel is closed and the current $I_D$ no longer flows. When a light 18 of a semiconductor laser having a wavelength of 830 nm is irradiated to the underside of the gate electrode 12 from the end plane of the device with zero current $I_D$, the width of the depletion layer 17 changes with the irradiation light intensity, and the drain current $I_D$ flows between the source electrode 11 and the drain electrode 13 so that the light intensity is detected.

It is now assumed that a beam diameter of the incident light 18 is 1 μm. In this case, since the beam diameter is 1 μm relative to the activation layer thickness of 0.3 μm, a light is irradiated to other area than the activation layer 14. However, since the buffer layer 15 is made of $Al_{0.3}Ga_{0.7}As$, it does not absorb the light having the wavelength of 830 nm and the time response characteristic is not deteriorated. Further, since the carriers are positively confined by the n-p heterojunction of the n-GaAs activation layer 14 and the p-$Al_{0.3}Ga_{0.7}As$ buffer layer 15, the pinch-off characteristic is good and the photo-current does not leak to the substrate.

Accordingly, in accordance with the present embodiment, the current representing the intensity of the light irradiated to the activation layer 14 is always obtained in a stable manner and the response is fast. Accordingly, a sufficient photo-current characteristic is attained even for a high light irradiation frequency.

Figure 3A:
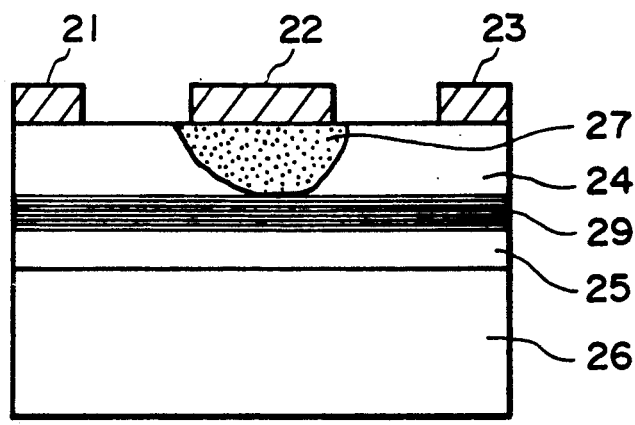
FIGS. 3A and 3B show a cross-sectional view and an energy band of a second embodiment of the FET type photo-detector of the present invention.
Figure 3B:
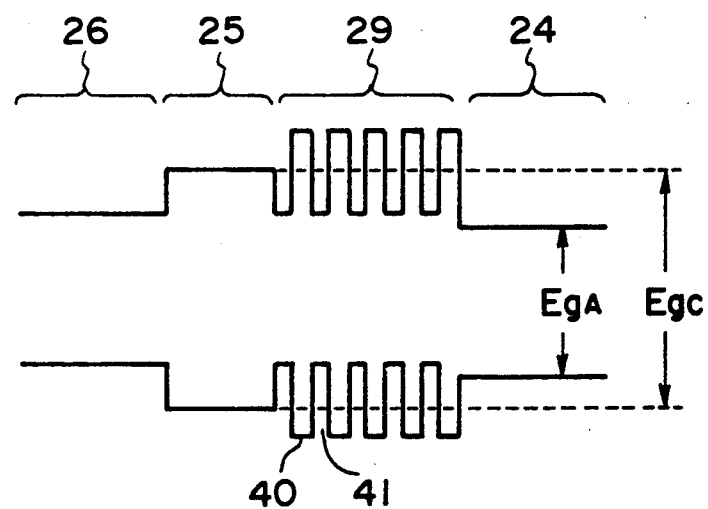

FIGS. 3A and 3B show a cross-sectional view and an energy band of a second embodiment of the FET type photo-detector of the present invention. The like elements are designated by the like numerals.

In the present embodiment, a buffer layer 25 having a thickness of 0.4 μm and made of i-$Al_{0.3}Ga_{0.7}As$ is formed on a semi-insulative GaAs substrate 26. A GaAs layer having a thickness of 30 Å and an $Al_{0.5}Ga_{0.5}As$ layer having a thickness of 60 Å are alternately and repeatedly laminated on the buffer layer 25 to form a super lattice buffer layer 29 having a total thickness of 0.45 μm. In FIG. 3A, numeral 40 in the super lattice buffer layer 29 denotes an $Al_{0.5}Ga_{0.5}As$ barrier layer and numeral 41 denotes a GaAs well layer. An n-GaAs activation layer 24 having a thickness of 0.3 μm is deposited on the super lattice buffer layer 29. Au Ge/Au source electrode 21 and drain electrode 23, and an Al gate electrode 22 are formed on the activation layer 24. A gate length is 1 μm, a gate width is 200 μm and a spacing between the respective electrodes is 1 μm.

When the buffer layer is of super lattice structure like in the present embodiment, the band gap may be grasped as a distance between base energy levels created in a conduction band and a fill band by a quantum effect. In the present embodiment, a band width $Eg_C$ of a lowest sub-band created by the quantum effect of the super lattice buffer layer 29 is wider than a band gap $Eg_A$ of the activation layer 24. Further, a lowest energy level of the conduction band of the super lattice buffer layer 29 is selected to be higher than a potential of the conduction band of the activation layer 24. In this case, the combination of the materials of the super lattice may be that at least one of them is made of a material having a wider band gap than that of the activation layer and others may be made of materials which have equal, larger or smaller band gaps to or than that of the activation layer.

In the photo-detector of the present embodiment, like in the previous embodiment, bias voltages are applied to the electrodes 21, 22 and 23 and the light is irradiated while the depletion layer 27 extends throughout the activation layer 24, that is, under zero drain current $I_D$, and the photo-current is detected. Since the GaAs/$Al_{0.5}Ga_{0.5}As$ super lattice buffer layer 29 is deposited under the activation layer 24, the light irradiated thereto is not essentially absorbed and the response characteristic is not affected. The super lattice buffer layer 29 serves as the barrier to prevent the carriers in the activation layer 24 from leaking into the i-$Al_{0.3}Ga_{0.7}As$ buffer layer 25 or the substrate 26. By providing the super lattice buffer layer 29 in the hetero-interface of the activation layer 24, the condition of the interface is improved and the photo-current characteristic is improved.

We claim:

1. A field effect transistor type photo-detector, comprising:
   a substrate;
   a super-lattice structure semiconductor buffer layer arranged on said substrate;
   a semiconductor activation layer formed on said super-lattice structure semiconductor buffer layer;
   a source electrode, a drain electrode and a gate electrode arranged on said semiconductor activation layer; and
   a further buffer layer arranged between said substrate and said super-lattice structure semiconductor buffer layer;
   wherein a depletion layer for controlling a current flowing between said source electrode and said drain electrode is created in said semiconductor activation layer by applying a voltage to said gate electrode, wherein when light irradiates said semiconductor activation layer, a width of the depletion layer changes, wherein a lowest energy sub-bank of said super-lattice structure semiconductor buffer layer has a wider band width than a band gap of said semiconductor activation layer, and wherein the lowest energy sub-band of said super lattice structure semiconductor buffer layer serves as a barrier to carriers.

2. A field effect transistor type photo-detector according to claim 1, wherein said semiconductor activation layer comprises n-type GaAs.

3. A field effect transistor type photo-detector according to claim 2, wherein a thickness of said semiconductor activation layer is 0.3 μm.

4. A field effect transistor type photo-detector according to claim 2, ;wherein said super-lattice structure semiconductor buffer layer comprises a first AlGaAs layer arranged on said substrate and wherein alternatively and repeatedly laminated GaAs well and second AlGaAs barrier layers are arranged on said first AlGaAs layer.

5. A field effect transistor type photo-detector according to claim 4, wherein a thickness of said GaAs well layer is 30 Å, a thickness of each of said first AlGaAs layer and said second AlGaAs layer barrier layer is 40 Å, and wherein a thickness of said super-lattice structure semiconductor buffer layer is 0.45 μm.

6. A field effect transistor type photo-detector according to claim 1, wherein said further buffer layer comprises undoped AlGaAs.

7. A field effect transistor type photo-detector according to claim 6, wherein a thickness of said further buffer layer is 0.4 μm.

8. A field effect transistor type photo-detector, comprising:
   a substrate;

a buffer layer comprising p-type AlGaAs arranged on said substrate;
an activation layer comprising n-type GaAs arranged on said buffer layer; and
a source electrode, a drain electrode and a gate electrode arranged on said activation layer;
wherein a depletion layer for controlling a current flowing between said source electrode and said drain electrode is created in said activation layer by applying a voltage to said gate electrode, wherein when a light irradiates said activation layer, the width of the depletion layer changes, wherein said buffer layer has a wider band gap than that of said activation layer, wherein said buffer layer has an energy band to serve as a barrier to carriers, wherein a thickness of said buffer layer is 0.4 μm, and wherein a thickness of said activation layer is 0.2 μm.

9. A field effect transistor type photo-detector, comprising:
a substrate;
a p-type semiconductor buffer layer arranged on said substrate;
an n-type semiconductor activation layer arranged on said buffer layer; and
a source electrode, a drain electrode and a gate electrode arranged on said activation layer;
wherein a depletion layer for controlling a current flowing between said source electrode and said drain electrode is created in said activation layer by applying a voltage to said gate electrode, wherein when a light irradiates said activation layer, the width of the depletion layer changes, wherein said buffer layer has a band gap wider than that of said activation layer, wherein said buffer layer has an energy band to serve as a barrier to carriers, wherein a thickness of said buffer layer is 0.4 μm, and wherein a thickness of said activation layer is 0.2 μm.

10. A field effect transistor type photo-detector according to claim 9, wherein said buffer layer comprises AlGaAs, and wherein said activation layer comprises GaAs.

11. A field effect transistor type photo-detector according to claim 8, wherein the band gap of said buffer layer is wide enough to prevent the absorption of a light having the same wavelength as that of a light which irradiates said activation layer.

12. A field effect transistor type photo-detector according to claim 9, wherein the and gap of said buffer layer is wide enough to prevent the absorption of a light having the same wavelength as that of a light which irradiates said activation layer.

* * * * *

UNITED STATES PATENT AND TRADEMARK OFFICE
CERTIFICATE OF CORRECTION

PATENT NO. : 5,196,717
DATED : March 23, 1993
INVENTOR(S) : TAMAYO HIROKI, ET AL.

It is certified that error appears in the above-identified patent and that said Letters Patent is hereby corrected as shown below: ON THE TITLE PAGE

IN [56] REFERENCES CITED

Under OTHER PUBLICATIONS, insert:
--Papers of The Institute of Electronics and Communication Engineers of Japan, "High-speed Photodetectors Using the GaAs MESFET", T. Umeda, et al., Vol. J68-C. pp. 263-269, April, 1985.--.

COLUMN 2

Line 37, "p-$Al_{0.3}$Ga0.7As" should read --p-$Al_{0.3}Ga_{0.7}As$--.
Line 61, "Schotcky" should read --Schottky--.

COLUMN 4

Line 48, ";wherein" should read --wherein--.
Line 58, "40 Å," should read --60 Å,--.

COLUMN 6

Line 23, "and" should read --band--.

Signed and Sealed this

Twenty-fifth Day of January, 1994

Attest:

BRUCE LEHMAN

Attesting Officer     Commissioner of Patents and Trademarks